(12) United States Patent
Niikura

(10) Patent No.: US 6,310,758 B1
(45) Date of Patent: Oct. 30, 2001

(54) LEAD TERMINAL AND ELECTRONIC COMPONENT INCLUDING LEAD TERMINAL

(75) Inventor: Tomoki Niikura, Namerikawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/706,604

(22) Filed: Nov. 6, 2000

(30) Foreign Application Priority Data

Nov. 12, 1999 (JP) ................................................. 11-323010

(51) Int. Cl.⁷ ..................................................... H01G 4/228
(52) U.S. Cl. ........................ 361/309; 361/309; 361/308.1; 361/310; 361/303
(58) Field of Search .................................... 361/309, 310, 361/308.1, 307, 303, 306.1, 531, 537, 540, 538

(56) References Cited

U.S. PATENT DOCUMENTS

| H498 | * | 7/1988 | Keller et al. | 361/404 |
|---|---|---|---|---|
| 4,598,972 | * | 7/1986 | Mullen, III et al. | 339/258 |
| 5,124,880 | * | 6/1992 | Okamoto et al. | 361/306 |
| 5,212,345 | * | 5/1993 | Gutierrez | 174/52.5 |
| 5,451,716 | * | 9/1995 | Hasegawa et al. | 174/52.4 |
| 5,910,879 | * | 6/1999 | Herbert | 361/306.1 |
| 5,967,858 | * | 10/1999 | Yamada | 439/736 |
| 6,224,388 | * | 5/2001 | Ahr et al. | 439/55 |

FOREIGN PATENT DOCUMENTS

| 63-67908 | 3/1988 | (JP) . |
|---|---|---|
| 6-251905 | 9/1994 | (JP) . |
| 7-291344 | 11/1995 | (JP) . |

* cited by examiner

Primary Examiner—Dean A. Reichard
Assistant Examiner—Nguyen Ha
(74) Attorney, Agent, or Firm—Keating & Bennett, LLP

(57) ABSTRACT

An electronic component device includes first and second lead terminals arranged to hold an electronic component element, e.g. a piezoelectric resonator, and are electrically connected to the piezoelectric resonator. In the first and second lead terminals, first and second substantially L-shaped end sections are provided at ends of first and second substantially linear lead terminal bodies. The electronic component device is held by a first side and a second side of the first substantially L-shaped end section and a first side and a second side of the second substantially L-shaped end section. Lead terminals arranged to be joined to and to hold the electronic component element between the lead terminals. The lead terminals are arranged such that the distance between the lead terminals does not need to be changed even when electronic component elements having different thicknesses are used.

23 Claims, 4 Drawing Sheets (a) FIG. 5
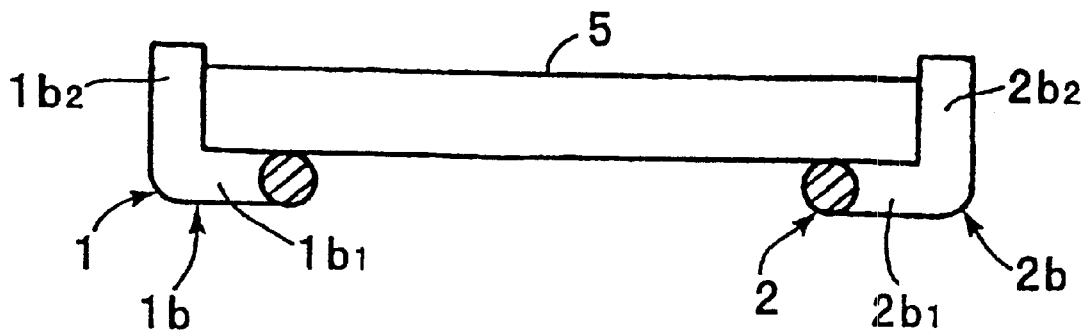
(b)
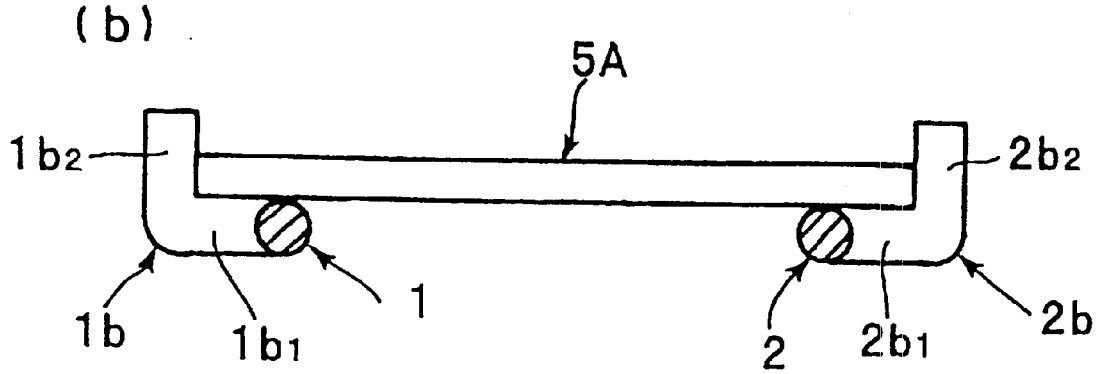

LEAD TERMINAL AND ELECTRONIC COMPONENT INCLUDING LEAD TERMINAL

BACKGROUND OF THE INVENTION

1. Field of the Invention

The present invention relates to a lead terminal to be connected and to hold an electronic component elements, such as, an energy-trap type piezoelectric resonator, and the present invention also relates to an electronic component including such a lead terminal.

2. Description of the Related Art

Conventionally, a lead terminal including a U-shaped cup-like section has been used as a lead terminal and joined to an electronic component device, such as a piezoelectric resonator. An example of this type of lead terminal is disclosed in, for example, Japanese Unexamined Patent Application Publication No. 63-67908.

FIG. 6 illustrates lead terminals each having a U-shaped cup-like section. In lead terminals 51 and 52 shown in FIG. 6, substantially U-shaped cup-like sections 51b and 52b are arranged to extend continuously with and along side ends of corresponding linear lead terminal bodies 51a and 52a. The lead terminal bodies 51a and 52a consist of narrow plate-shaped members. In the structure of the U-shaped cup-like section 51b, a pair of stopper sections 51b, and 51b$_2$ are arranged to extend continuously beside each other at one end of the U-shaped cup-like section 51b. In the structure of the U-shaped cup-like section 52b, a pair of stopper sections 52b$_1$ and 52b$_2$ are arranged to extend continuously beside each other at one end of the U-shaped cup-like section 52b.

The lead terminals 51 and 52 are obtained by punching out plate-shaped, metallic members, and by bending ends of the punched out plate-shaped, metallic members to form the U-shaped cup-like sections 51b and 52b.

As shown in FIG. 7A which is a horizontal sectional view, when the pair of lead terminals 51 and 52 shown in FIG. 6 are used, a piezoelectric resonator 53 is held by inserting the resonator between the U-shaped cup-like sections 51b and 52b. More specifically, one end of the piezoelectric resonator 53 is inserted into and soldered to the U-shaped cup-like section 51b in order to electrically connect the U-shaped cup-like section 51b to one of the electrodes of the piezoelectric resonator 53. Similarly, the other end of the piezoelectric resonator 53 is inserted into the U-shaped cup-like section 52b in order to electrically connect the other electrode of the piezoelectric resonator 53 to the U-shaped cup-like section 52b.

Accordingly, the piezoelectric resonator 53 can be reliably held by the pair of lead terminals 51 and 52. In addition, the electrodes of the piezoelectric resonator 53 can be electrically connected to the corresponding lead terminals 51 and 52.

As shown in FIGS. 7A and 7B, however, when the piezoelectric resonator 53 that is relatively thin, and a piezoelectric resonator 53A that is relatively thick, are used, the distance or space between the pair of lead terminals 51b and 52b must inevitably be changed. In other words, since the space between the lead terminals 51 and 52 varies with the thicknesses of the piezoelectric resonators 53 and 53A, the space between the lead terminals 51 and 52 cannot be made constant without correcting the sizes of the piezoelectric resonators 53 and 53A in the direction of a line connecting the lead terminals 51 and 52. Therefore, in producing the piezoelectric resonator 53 or 53A, the piezoelectric resonator 53 or 53A must be cut out from a mother piezoelectric plate in correspondence with its position between the lead terminals 51 and 52. Consequently, not only is a substrate used with poor efficiency and the steps of producing the piezoelectric resonators 53 and 53A made complicated, but costs are also increased.

The stopper sections 51b$_1$, 51b$_2$, 52b$_1$ and 52b$_2$ are placed at both sides of the piezoelectric resonator 53 or 53A in the thickness direction thereof, so that the size of a completed piezoelectric resonator component in the thickness direction of the piezoelectric resonator 53 or 53A inevitably becomes much larger. Therefore, the size of the piezoelectric resonator part cannot be reduced.

Wire rods having circular end surfaces, that is, round wire rods, are frequently used for the lead terminals which are attached to various types of electronic component devices such as piezoelectric resonators. Such lead terminals are disclosed in, for example, Japanese Unexamined Patent Application Publication Nos. 7-291344 and 6-251905.

Although round wire rods with various forms such as a round wire rod with a bent section at an intermediate portion thereof have been proposed, rods having a U-shaped cup-like section for holding an electronic component device are not known.

SUMMARY OF THE INVENTION

In order to overcome the problems described above, preferred embodiments of the present invention provide lead terminals which are to be attached to and hold an electronic component device therebetween, the lead terminals being arranged and constructed to allow spaces between the lead terminals to be constant regardless of the thickness of the electronic component device used, and to allow for reduction in size of the electronic component in the thickness direction of the electronic component device.

Also, preferred embodiments of the present invention provide an electronic component including the leads having the unique characteristics described in the preceding paragraph.

According to one preferred embodiment of the present invention, a lead terminal for use in holding an electronic component device and being electrically connected to the electronic component device includes a substantially linear lead terminal body, and a substantially L-shaped end section including a first side and a second side. The first side is located at one end of the lead terminal body so as to be located in substantially the same plane as the lead terminal body by bending a portion of the substantially L-shaped end section in a direction substantially perpendicular to the lead terminal body. The second side is defined by a bent portion including one end of the first side that is bent in a direction substantially perpendicular to the plane including the lead terminal body. In the lead terminal, the electronic component device is held by the first side and the second side of the substantially L-shaped end section.

The internal angle between the first side and the second side is preferably within a range of about 85° to about 90°.

The length of the second side is preferably about 0.2 mm to about 0.9 mm greater than the size, measured along the second side of the lead terminal, of a side of the electronic component device to which the lead terminal is attached.

The length of the lead terminal body is preferably greater than the size of the electronic component device measured along the lengthwise direction of the lead terminal body. In addition, a portion of the electronic component device extending in the lengthwise direction of the lead terminal body is preferably held along the full length thereof by the lead terminal.

The lead terminal may be attached to a piezoelectric resonator that defines the electronic component device.

According to another preferred embodiment of the present invention, an electronic component includes a lead having a lead terminal used to hold an electronic component device and electrically connected to the electronic component. The lead terminal includes a substantially linear lead terminal body, and a substantially L-shaped end section including a first side and a second side. The first side is located at one end of the lead terminal body so as to be located in the same plane as the lead terminal body by bending a portion of the substantially L-shaped end section in a direction that is substantially perpendicular to the lead terminal body. The second side is located at one end of the first side so as to extend in a direction that is substantially perpendicular to the plane including the lead terminal body. The electronic component also includes the electronic component device held by the first side and the second side of the substantially L-shaped end section.

The electronic component device may be a piezoelectric resonator or other electronic component devices.

The piezoelectric resonator preferably includes a substantially rectangular, plate-shaped piezoelectric substrate.

When the piezoelectric resonator includes a substantially rectangular, plate-shaped piezoelectric substrate, the piezoelectric resonator may be an energy-trap type resonator using a thickness vertical oscillatory mode of the substantially rectangular, plate-shaped piezoelectric substrate.

With such a novel electronic component having a unique lead with the structural features described in the preceding paragraphs, the electronic component having such a lead may also include a capacitor mounted to a side of the pair of lead terminals opposite to the side where the electronic component device is mounted.

The above and other novel features, characteristics, advantages and elements of the present invention will become more apparent from the following detailed description of preferred embodiments thereof with reference to the accompanying drawings. It is to be expressly understood, however, that the drawings are for the purpose of illustration only and are not intended as a definition of the limits of the present invention.

BRIEF DESCRIPTION OF THE DRAWINGS

FIG. 5 (views a and b) are sectional views used to show that the space between the lead terminals does not vary when piezoelectric resonators with different thicknesses are used as electronic component devices to be mounted to the lead terminals.

DETAILED DESCRIPTION OF PREFERRED EMBODIMENTS

With reference to the figures, the present invention will be described by illustrating preferred embodiments thereof.

Figure 1:
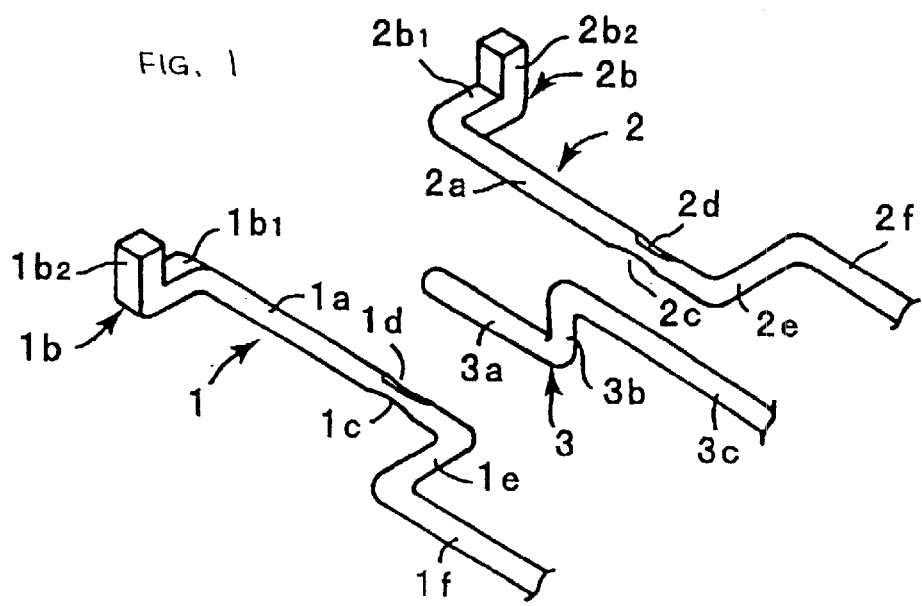
FIG. 1 is a partial cutaway perspective view of a preferred embodiment of lead terminals in accordance with the present invention.

FIG. 1 is a perspective view of a preferred embodiment of lead terminals in accordance with the present invention. In this preferred embodiment, the lead terminals shown in FIG. 1 are used to construct a piezoelectric component including leads.

As shown in FIG. 1, a pair of lead terminals 1 and 2 of this preferred embodiment of the present invention are arranged to be separated from each other by a predetermined distance. A lead terminal 3 defined by a bent round wire rod is disposed between the lead terminals 1 and 2.

The lead terminals 1 and 2 are preferably formed by bending round, rod-shaped, metallic wires.

The lead terminals 1 and 2 include linear lead terminal bodies 1a and 2a, respectively. Substantially L-shaped end sections 1b and 2b are provided at ends of the lead terminal bodies 1a and 2a, respectively. When the end sections 1b and 2b are viewed in cross-section perpendicular to the direction in which the lead terminal bodies 1a and 2a extend, they are substantially L-shaped. By bending ends of the lead terminal bodies 1a and 2a in the direction that is substantially perpendicular to the direction in which the lead terminal bodies 1a and 2a extend, first sides $1b_1$ and $2b_1$ of the corresponding substantially L-shaped end sections 1b and 2b are defined. The first sides $1b_1$ and $2b_1$ are located in the same plane as the lead terminal bodies 1a and 2a. Although the angle between the first side $1b_1$ and the lead terminal body 1a and the angle between the first side $2b_1$ and the lead terminal body 2a are not particularly limited, they are preferably in a range of from about 85° to about 90°. If these angles are greater than about 90°, an electronic component cannot be made thin, whereas, if the angles are smaller than about 85°, the electronic component becomes difficult to manufacture.

Second sides $1b_2$ and $2b_2$ are preferably formed by bending upwardly ends of the corresponding first sides $1b_1$ and $2b_1$ of the wire rods. The second sides $1b_2$ and $2b_2$ extend in the direction that is substantially perpendicular to the plane including the lead terminal bodies $1a$ and $2a$.

The internal angle between the first side $1b_1$ and the second side $1b_2$ and the internal angle between the first side $2b_1$ and the second side $2b_2$ are not particularly limited as long as they define substantially L shaped configurations. However, the internal angles are preferably in the range of from about 85° to about 90°.

Recesses $1c$ and $2c$ are provided in the bottom surfaces of the corresponding lead terminal bodies $1a$ and $2a$, that is, in surfaces at sides of the corresponding lead terminal bodies $1a$ and $2a$ opposite to the sides from which the second sides $1b_2$ and $2b_2$ extend. The recesses $1c$ and $2c$ are formed by pressing portions of the corresponding lead terminal bodies $1a$ and $2a$. This results in the formation of recesses $1d$ and $2d$ in the top surfaces of the lead terminal bodies $1a$ and $2a$. However, these top surface recesses $1d$ and $2d$ are not necessary.

The recesses $1c$ and $2c$ are arranged to reduce the thicknesses of the lead terminal bodies $1a$ and $2a$, respectively, when a capacitor (described later) is attached thereto.

Bent sections $1e$ and $2e$ are provided at the other ends of the corresponding lead terminal bodies $1a$ and $2a$. Lead-out sections $1f$ and $2f$ are provided by further bending ends of the corresponding bent sections $1e$ and $2e$ so as to extend substantially parallel to the corresponding lead terminal bodies $1a$ and $2a$. The bent sections $1e$ and $2e$ are arranged to reduce external forces transmitted towards the lead terminal bodies $1a$ and $2a$ from portions attached to a printed circuit board.

Similarly, the lead terminal 3 includes a bent section $3b$ provided at an end opposite to an end of a lead terminal body $3a$. From an end of the bent section $3b$ opposite to the lead terminal body $3a$, a lead-out section $3c$ extends substantially parallel to the lead terminal body $3a$.

Figure 2:
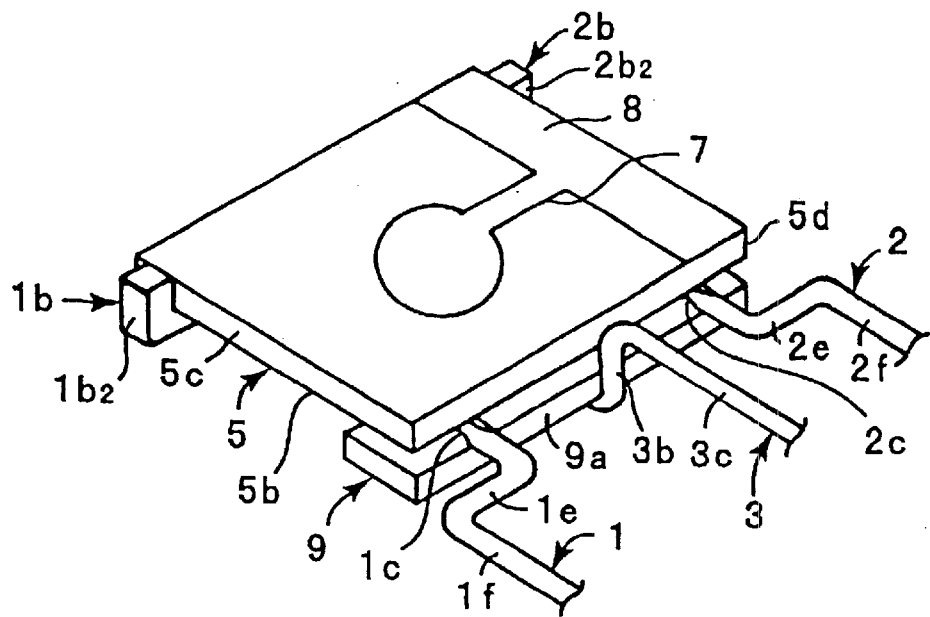
FIG. 2 is a partial cutaway perspective view schematically illustrating a preferred embodiment of a piezoelectric component with leads in accordance with the present invention.

In this preferred embodiment, as shown in FIG. 2, a piezoelectric resonator 4, as an example of an electronic component, is held by the lead terminals 1 and 2. The piezoelectric resonator 4 has a structure in which excitation electrodes 6 (the bottom excitation electrode 6 is not shown) are provided on both primary surfaces of a substantially rectangular, plate-shaped piezoelectric substrate 5. The excitation electrode 6 located on a top surface $5a$ of the piezoelectric substrate is electrically connected to a terminal electrode 8 through a lead-out electrode 7. The terminal electrode 8 is arranged so as to extend along an edge of the piezoelectric substrate 5 defined by an end surface $5d$ and the top surface $5a$. The edge of the terminal electrode 8 extends to the end surface $5d$. The terminal electrode 8 is attached to the substantially L-shaped end section $2b$ of the lead terminal 2 using an electrically conductive bond such as solder (not shown).

Similarly, a lead-out electrode and a terminal electrode are placed beside the bottom excitation electrode 6. The bottom terminal electrode is arranged so as to extend along an edge of the piezoelectric substrate 5 defined by an end surface $5c$ and a bottom surface $5b$. The edge of the terminal electrode 8 extends to the end surface $5c$. The bottom terminal electrode 6 is similarly adhered to the substantially L-shaped end section $1b$ of the lead terminal 1 using an electrically conductive bond.

In holding and attaching the piezoelectric resonator 4 between the lead terminals 1 and 2, the lead terminals 1 and 2 are arranged to have a predetermined space therebetween, and the piezoelectric resonator 4 is inserted between them. In this case, since the internal angle between the first side $1b_1$ and the second side $1b_2$ of the substantially L-shaped end section $1b$, and the internal angle between the first side $2b_1$ and the second side $2b_2$ of the substantially L-shaped end section $2b$ are in the range of from about 85° to about 90°, the top surfaces of the first and second sides $1b_1$ and $2b_1$ are brought into contact with the bottom surface of the piezoelectric resonator 4, and the internal surfaces of the second sides $1b_2$ and $2b_2$ are brought into contact with the end surfaces $5d$ and $5c$, respectively, of the piezoelectric resonator 4. This causes the piezoelectric resonator 4 to be reliably held between the lead terminals 1 and 2 (see FIG. 5A).

As shown in FIG. 5B, even if a piezoelectric substrate 5A of the piezoelectric resonator 4 is thin, the piezoelectric resonator 4 can be similarly held between the lead terminals 1 and 2. In this case, the space between the lead terminals 1 and 2 does not need to be changed. In other words, since the piezoelectric resonator 4 is held using the substantially L-shaped end sections $1b$ and $2b$, it is not necessary to change the space between the lead terminals 1 and 2 even when a piezoelectric resonator with a different thickness is used.

Figure 3:
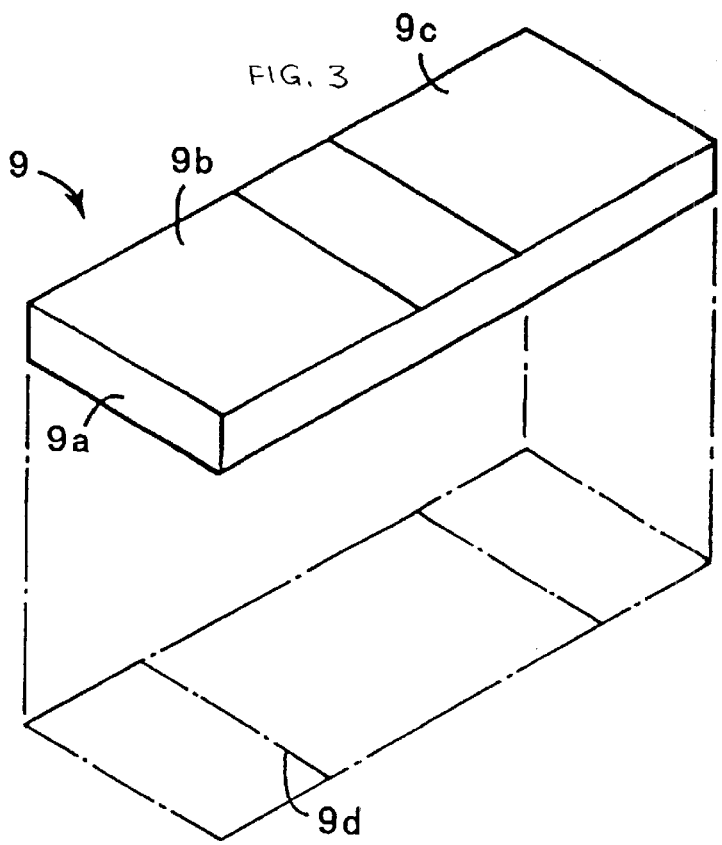
FIG. 3 is a perspective view of a capacitor mounted in the preferred embodiment of the piezoelectric component with leads in accordance with the present invention.

Returning to FIG. 2, a capacitor 9 is preferably mounted to surfaces of the lead terminals 1 and 2 opposite to the sides of the lead terminals 1 and 2 to which the piezoelectric resonator 4 is mounted. In other words, the capacitor 9 is mounted to the bottom surfaces of the lead terminals 1 and 2. As shown in FIG. 3, the capacitor 9 includes a substantially rectangular, plate-shaped dielectric substrate $9a$. The dielectric substrate $9a$ may be made of a suitable dielectric ceramic material such as barium titanate. Capacitor electrodes $9b$ and $9c$ are provided on the top surface of the dielectric substrate $9a$ so as to be separated by a predetermined gap. A capacitor electrode $9d$ is disposed at the approximate center portion of the bottom surface of the dielectric substrate $9a$. The capacitor electrode $9d$ is arranged so as to overlap the capacitor electrodes $9b$ and $9c$ through the dielectric substrate $9a$. Thus, a three-terminal type capacitor including the capacitor electrodes $9b$ to $9d$ is provided.

Returning to FIG. 2, the top surface of the dielectric substrate $9a$ of the capacitor 9 is mounted to the lead terminals 1 and 2 so as to fit into the recesses $1c$ and $2c$ of the corresponding lead terminals 1 and 2. Here, the capacitor electrodes $9b$ and $9c$ are electrically connected to the recesses $1c$ and $2c$ of the corresponding lead terminals 1 and 2 through an electrically conductive bond such as solder.

The lead terminal body $3a$ of the lead terminal 3 is attached to the capacitor electrode $9d$ using an electrically conductive bond such as solder.

Therefore, in a piezoelectric component 10 with leads shown in FIG. 2, a piezoelectric oscillator which incorporates a load capacitance is defined by the energy-trap type piezoelectric resonator 4 and the three-terminal-type capacitor 9.

In the above-described lead terminals 1 and 2, the recesses 1c and 2c are provided in the bottom surfaces of the corresponding lead terminal bodies 1a and 2a, so that, when the capacitor 9 is mounted to the lead terminals 1 and 2, the size of the electronic component 10 in the thickness direction is reduced by an amount corresponding to the sizes of the recesses 1c and 2c.

The sizes of the sides of the piezoelectric resonator 4 in the lengthwise direction of the lead terminal bodies 1a and 2a are preferably smaller than the sizes of the lead terminal bodies 1a and 2a in the lengthwise direction thereof. Therefore, the piezoelectric resonator 4 is reliably brought into contact with the lead terminal bodies 1a and 2a. Preferably, the lengths of the inside surfaces of the second sides $1b_2$ and $2b_2$, that is, the heights measured from the top surfaces of the first sides $1b_1$ and $2b_1$ to the ends of the second sides $1b_2$ and $2b_2$, respectively, are from about 0.2 mm to about 0.9 mm longer than the size of the piezoelectric resonator 4 in the thickness direction thereof. This makes it possible to more reliably and securely hold the piezoelectric resonator 4 between the substantially L-shaped end sections 1b and 2b, and to increase the strength with which it is affixed to the lead terminals 1 and 2.

When the lengths of the inside surfaces of the second sides $1b_2$ and $2b_2$ are longer by less than about 0.2 mm, and when the piezoelectric resonator 4 is attached to the lead terminals 1 and 2 using an electrically conductive bond, the top surface of the piezoelectric resonator 4, though depending on the thickness of the electrically conductive bond, may protrude above the top ends of the substantially L-shaped end sections 1b and 2b, so that the size of the piezoelectric component 10 in the thickness direction thereof is increased. When the lengths of the inside surfaces of the second sides $1b_2$ and $2b_2$ are longer by more than about 0.9 mm, the amount by which the second sides $1b_2$ and $2b_2$ protrude upward is likewise increased, so that the size of the piezoelectric component 10 in the thickness direction becomes greater.

As described above, in this preferred embodiment, the piezoelectric resonator 4 is held by and attached to the substantially L-shaped end sections 1b and 2b. Therefore, as mentioned above, the size of the piezoelectric component 10 in the thickness direction can be greatly decreased. In addition, the lead terminal bodies 1a and 2a are linear bodies, so that the piezoelectric resonator 4 can be reliably and securely held.

Figure 4:
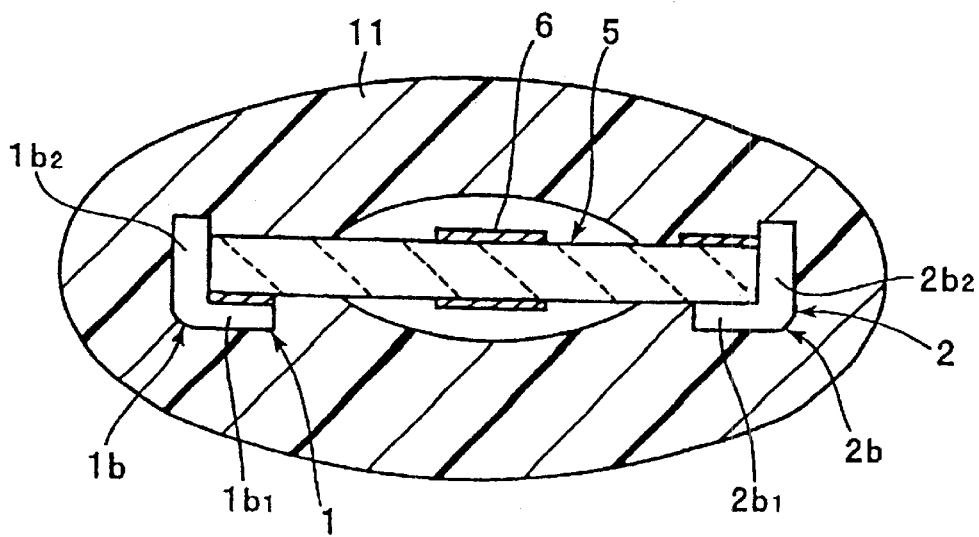
FIG. 4 is a sectional view showing a state in which the outer surface of the preferred embodiment of the piezoelectric component with leads in accordance with the present invention is covered with resin.
Figure 6:
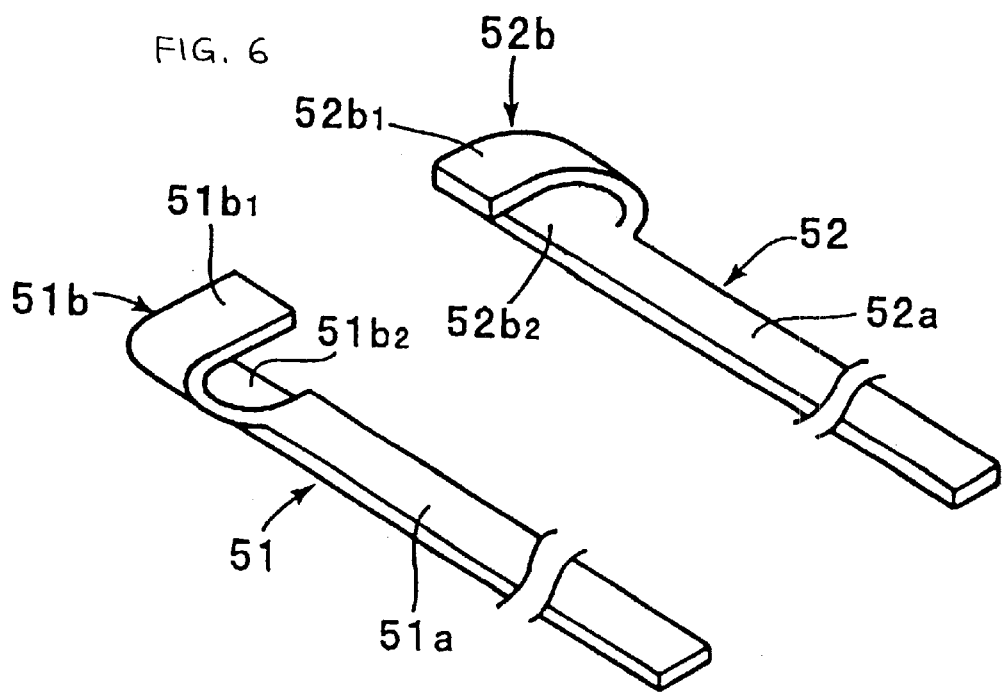
FIG. 6 is a perspective view of conventional lead terminals.
Figure 7:
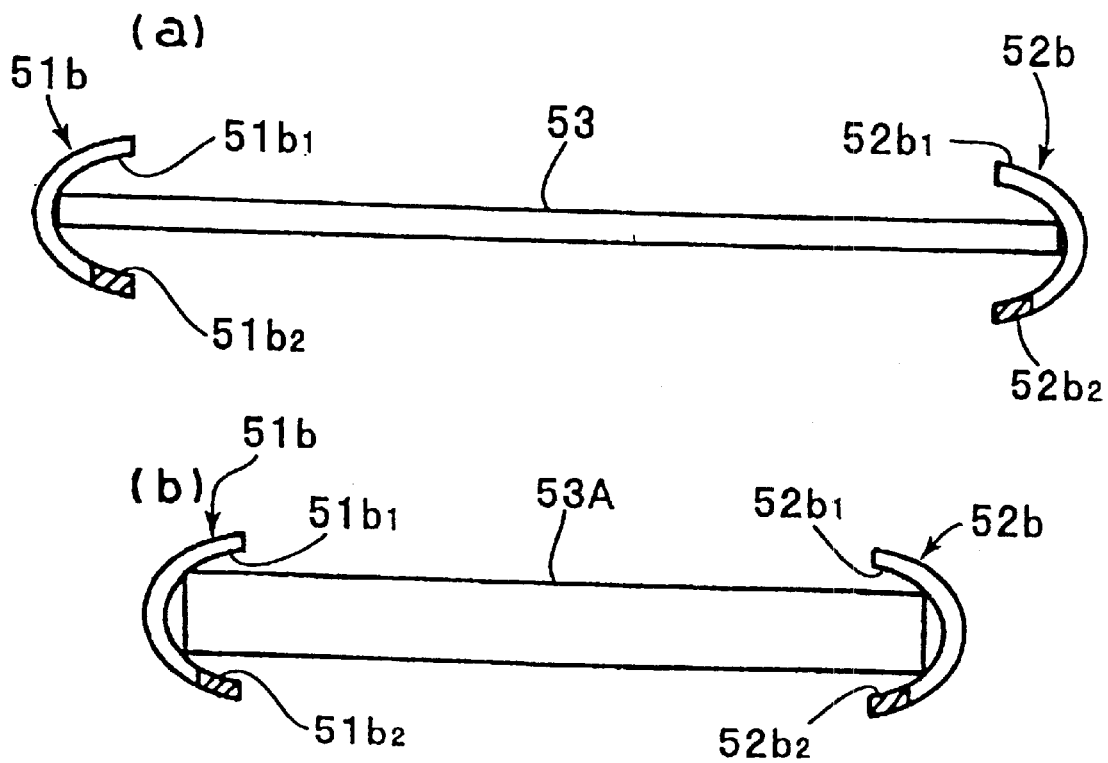
FIGS. 7A and 7B are sectional views used to illustrate the problem occurring when the cup-like lead terminals shown in FIG. 6 are used.

Ordinarily, the outside portions of the above-described piezoelectric component 10 excluding the outside portions of the terminal lead-out sections 1f, 2f, and 3c are covered with resin. FIG. 4 is a sectional view of a preferred embodiment of the piezoelectric component 10 having outer portions that are covered with resin. As can be easily seen from FIG. 4, a resin layer 11 is applied to the outer portions of the piezoelectric component 10 while maintaining a space A which is arranged to prevent interference with the oscillation of the piezoelectric resonator 4.

The aforementioned resin layer 11 may be formed of a suitable resinous material, such as epoxy resin.

Although, in the preferred embodiments described above, the lead terminal bodies 1a and 2a, the bent sections 1e and 2e, and the lead-out sections 1f and 2f of the corresponding lead terminals 1 and 2 are made of wire rods which are substantially circular in cross-section, they may be formed of wire rods which are substantially rectangular in cross-section.

Although, in preferred embodiments described above, the recesses 1c and 2c for mounting the capacitor 9 thereto are provided, they do not need to be provided. The size of the piezoelectric component 10 in the thickness direction can be further reduced when the capacitor 9 has been mounted by forming a similar recess in the top surface of the lead terminal body 3a of the lead terminal 3.

Although, in preferred embodiments described above, the piezoelectric resonator 4 using a thickness vertical oscillatory mode is used as an electronic component device, a piezoelectric resonator using other vibration modes, such as a thickness sliding mode, may also be used as an electronic component device.

The present invention is not limited to a piezoelectric resonator, so that, for example, a piezoelectricfilter device may also be used. In addition, the present invention is not limited to piezoelectricdevices as electronic component devices, so that other types of electronic component devices, such as a capacitor, a thermistor, or a varistor may also be used. Accordingly, the present invention is not limited to particular types of electronic component devices.

According to the lead terminals of various preferred embodiments of the present invention, the above-described substantially L-shaped end sections are provided at the ends of the portions of the lead terminals used to hold an electronic component device and to electrically connect the electronic component device thereto, and the electronic component device is held by the substantially L-shaped first sides and second sides of the lead terminals. Therefore, even if electronic component devices with different thicknesses are used, that is, even if the sizes of the second sides in the lengthwise direction thereof are changed, it is not necessary to change the space between the pair of lead terminals. Therefore, when mounting electronic component devices with various thicknesses, the operations for producing electronic component devices are greatly simplified, and the substrates used to obtain electronic component devices are used with greater efficiency, so that costs can be minimized.

The lead terminal bodies are in the same plane as the first sides, so that the electronic component device can be reliably and securely placed on the lead terminal bodies and the first sides. This also reduces the size of the entire electronic component in the thickness direction thereof, that is, the size of the electronic component in the direction in which the second sides extend. Therefore, a much smaller electronic component with leads can be constructed.

When the internal angles of the first sides and the corresponding second sides fall within the range of from about 85° to about 90°, the end surfaces and the bottom surface of the electronic component device can be reliably held, so that the electronic component device is securely held, and a very small, thin electronic component with leads can be provided.

When the lengths of the second sides are greater than the sides of the electronic component device (to which the lead terminals are attached) extending along the second sides by about 0.2 mm to about 0.9 mm, the strength with which they are attached together using an electrically conductive bond such as solder can be increased, and a very thin piezoelectric component with leads can be provided.

When the lengths of the lead terminal bodies are greater than the size of the electronic component device in the lengthwise direction of the lead terminal bodies, so that the portion of the electronic component device extending in the lengthwise direction of the lead terminals are arranged so as to be held by the lead terminal bodies along its full length, the electronic component device can be reliably held by the lead terminal bodies.

When a piezoelectric resonator is used as an electronic component device, the lead terminals of various preferred embodiments of the present invention are used to make it possible to provide a thin piezoelectric resonator component in which the space between the lead terminals does not need to be changed in producing the piezoelectric resonator component.

In the electronic component with leads according to various preferred embodiments of the present invention, an electronic component device is held so that it contacts the first and second sides of the corresponding substantially L-shaped end sections of the pair of lead terminals. Therefore, the size of the electronic component with leads in the thickness direction can be much smaller, and, even if an electronic component device with a different thickness is used, the space between the pair of lead terminals does not need to be changed. Consequently, productivity of electronic components with leads is greatly increased, and costs thereof are greatly decreased.

When a piezoelectric resonator is used as the aforementioned electronic component device, a thin, inexpensive piezoelectric resonator component with leads can be provided in accordance with a preferred embodiment of the present invention.

When the piezoelectric resonator includes a substantially rectangular, plate-shaped piezoelectric substrate, the piezoelectric resonator is held so that the end surfaces and the bottom surface of the piezoelectric substrate contact the first and second sides of the substantially L-shaped end sections, making it possible to provide a piezoelectric resonator component with leads in which the piezoelectric resonator is reliably held.

When the piezoelectric resonator is of the energy-trap type while using a thickness vertical oscillatory mode of the substantially rectangular, plate-shaped piezoelectric substrate, a small, low-cost piezoelectric resonator component with leads having excellent productivity can be provided in accordance with preferred embodiments of the present invention.

When there is further provided a capacitor mounted to the sides of the pair of lead terminals opposite to the sides where the electronic component device is mounted, a thin piezoelectric resonator of the type which incorporates a load capacitance having excellent productivity can be provided.

While the invention has been described with reference to preferred embodiments thereof, many modifications and variations of the present invention are possible in light of the above teachings. It is therefore to be understood that within the scope of the appended claims, the invention may be practiced otherwise than as specifically described.

What is claimed is:

1. A lead terminal used to hold an electronic component device and to be electrically connected to the electronic component device, the lead terminal comprising:
    a substantially linear lead terminal body; and
    a substantially L-shaped end section including a first side and a second side, the first side being located at one end of the lead terminal body so as to be located in substantially the same plane as the lead terminal body and a portion of the substantially L-shaped end section being bent in a direction substantially perpendicular to the lead terminal body, and the second side being defined by one end of the first side which is bent in a direction substantially perpendicular to the plane including the lead terminal body;
    wherein the first and second sides of the substantially L-shaped end section are arranged to hold the electronic component device by the first side and the second side of the substantially L-shaped end section.

2. A lead terminal according to claim 1, wherein the internal angle between the first side and the second side is within a range of from about 85° to about 90°.

3. A lead terminal according to claim 1, wherein the length of the second side is about 0.2 mm to about 0.9 mm greater than the size, measured along the second side of the lead terminal, of a side of the electronic component device to which the lead terminal is attached.

4. A lead terminal according to claim 1, wherein the length of the lead terminal body is greater than the size of the electronic component device measured along the lengthwise direction of the lead terminal body, and wherein a portion of the electronic component device extending in the lengthwise direction of the lead terminal body is held along the full length thereof by the lead terminal.

5. A lead terminal according to claim 1, wherein the electronic component device is a piezoelectric resonator.

6. A lead terminal according to claim 1, wherein the substantially linear lead terminal body and the substantially L-shaped end section are made of a bent round, rod-shaped, metallicwire.

7. A lead terminal according to claim 1, wherein at least one recess is provided in a bottom surface of the substantially linear lead terminal body.

8. A lead terminal according to claim 1, wherein the at least one recess is arranged to define a reduced thickness portion of the substantially linear lead terminal body and to have a capacitor mounted thereon.

9. A lead terminal according to claim 1, wherein at least one recess is provided in a top surface of the substantially linear lead terminal body.

10. A lead terminal according to claim 1, wherein the electronic component is one of a capacitor, a thermistor, and a varistor.

11. An electronic component comprising:
    a pair of the lead terminals each including:
        a substantially linear lead terminal body; and
        a substantially L-shaped end section including a first side and a second side, the first side being located at one end of the lead terminal body so as to be located in substantially the same plane as the lead terminal body and a portion of the substantially L-shaped end section being bent in a direction substantially perpendicular to the lead terminal body, and the second side being defined by one end of the first side which is bent in a direction substantially perpendicular to the plane including the lead terminal body; and an electronic component device held between the substantially L-shaped end sections of the pair of the lead terminals such that the electronic component device contacts the first and second sides of the corresponding substantially L-shaped end sections.

12. An electronic component according to claim 11, wherein the electronic component device is a piezoelectric resonator.

13. An electronic component according to claim 11, wherein the electronic component is one of a capacitor, a thermistor, and a varistor.

14. An electronic component according to claim 11, wherein the electronic component is a piezoelectric resonator including a substantially rectangular, plate-shaped piezoelectric substrate.

15. An electronic component according to claim 14, wherein the piezoelectric resonator is an energy-trap type resonator vibrating in a thickness vertical oscillatory mode of the substantially rectangular, plate-shaped piezoelectric substrate.

16. An electronic component according to claim 11, further comprising a capacitor mounted to a side of the pair of lead terminals opposite to the side where the electronic component device is mounted.

17. An electronic component according to claim 11, wherein for each of the pair of lead terminals, the internal angle between the first side and the second side is within a range of from about 85° to about 90°.

18. An electronic component according to claim 11, wherein for each of the pair of lead terminals, the length of the second side is about 0.2 mm to about 0.9 mm greater than the size, measured along the second side of the lead terminal, of a side of the electronic component device to which the lead terminal is attached.

19. An electronic component according to claim 11, wherein for each of the pair of lead terminals, the length of the lead terminal body is greater than the size of the electronic component device measured along the lengthwise direction of the lead terminal body, and wherein a portion of the electronic component device extending in the lengthwise direction of the lead terminal body is held along the full length thereof by the lead terminal.

20. An electronic component according to claim 11, wherein for each of the pair of lead terminals, the substantially linear lead terminal body and the substantially L-shaped end section are made of a bent round, rod-shaped, metallic wire.

21. An electronic component according to claim 11, wherein for each of the pair of lead terminals, at least one recess is provided in a bottom surface of the substantially linear lead terminal body.

22. An electronic component according to claim 11, wherein for each of the pair of lead terminals, the at least one recess is arranged to define a reduced thickness portion of the substantially linear lead terminal body and to have a capacitor mounted thereon.

23. An electronic component according to claim 11, wherein for each of the pair of lead terminals, at least one recess is provided in a top surface of the substantially linear lead terminal body.

* * * * *